United States Patent [19]

Suzuki

[11] Patent Number: 5,466,985
[45] Date of Patent: Nov. 14, 1995

[54] METHOD FOR NON-DESTRUCTIVELY DRIVING A THICKNESS SHEAR MODE PIEZOELECTRIC ACTUATOR

[75] Inventor: Masahiko Suzuki, Nagoya, Japan

[73] Assignee: Brother Kogyo Kabushiki Kaisha, Nagoya, Japan

[21] Appl. No.: 405,400

[22] Filed: Mar. 15, 1995

Related U.S. Application Data

[63] Continuation of Ser. No. 252,165, May 31, 1994, abandoned.

[30] Foreign Application Priority Data

Jun. 30, 1993 [JP] Japan .................................. 5-161519

[51] Int. Cl.⁶ .................................................. H01L 41/09
[52] U.S. Cl. .................................... 310/333; 310/317
[58] Field of Search ............................ 310/317, 333; 347/19, 69

[56] References Cited

U.S. PATENT DOCUMENTS

| | | | |
|---|---|---|---|
| 3,623,795 | 11/1971 | Taylor et al. ............................ | 350/150 |
| 4,367,426 | 1/1983 | Kumada et al. ......................... | 310/358 |
| 4,584,590 | 4/1986 | Fischbeck et al. ..................... | 346/140 R |
| 4,825,227 | 4/1989 | Fischbeck et al. ..................... | 346/1.1 |
| 4,879,568 | 11/1989 | Bartky et al. ......................... | 346/140 R |
| 4,887,100 | 12/1989 | Michaelis et al. ...................... | 346/140 R |
| 4,973,981 | 11/1990 | Bartky et al. ......................... | 346/1.1 |
| 5,016,028 | 5/1991 | Temple ................................... | 346/140 R |
| 5,036,241 | 7/1991 | Michaelis et al. ...................... | 310/358 |

*Primary Examiner*—Thomas M. Dougherty
*Attorney, Agent, or Firm*—Oliff & Berridge

[57] ABSTRACT

A method for stably driving a piezoelectric actuator includes the steps of applying a pulse voltage for a maximum of 100 ms per cycle. The piezoelectric actuator is driven for extended periods of time with little deterioration in its performance characteristics so long as the duty ratio DR of the voltage pulse during one cycle is given by:

$$DR < [\{(T_C - T_D)/(T_C - 273) \times \{(|E_C| - |E_D|)/|E_C|\}]^{\frac{1}{2}}$$

where $T_C$ is the Curie temperature (in °K) of the piezoelectric material; $E_C$ is the coercive electric field in effect when the electric field is applied in the direction perpendicular to the direction of polarization; and $T_D$ and $E_D$ are, respectively, the temperature (in °K) and the electric field of the material in effect during operation.

10 Claims, 15 Drawing Sheets

Fig.5

| PIEZOELECTRIC CERAMIC MATERIAL | CURIE TEMPERATURE (°K) | COERCIVE ELECTRIC FIELD (kV/mm) |
|---|---|---|
| A | 598 | 1.0 |
| B | 488 | 0.85 |
| C | 413 | 0.6 |

Fig.8

MATERIAL A $\qquad$ $T_D = 293\,°K$

| $E_D$ kV/mm | DR | | | | | | | | | | CALCULATED DR |
|---|---|---|---|---|---|---|---|---|---|---|---|
| | 10% | | 30% | | 50% | | 70% | | 90% | | |
| | F(kHz) | | F(kHz) | | F(kHz) | | F(kHz) | | F(kHz) | | |
| | 1 | 10 | 1 | 10 | 1 | 10 | 1 | 10 | 1 | 10 | |
| 0.9 | □ | □ | ○ | □ | × | × | × | × | — | — | 30.63% |
| 0.7 | □ | □ | ○ | □ | ○ | □ | × | △ | × | × | 53.06% |
| 0.5 | □ | □ | □ | □ | ○ | □ | △ | ○ | × | × | 68.50% |
| 0.3 | □ | □ | □ | □ | □ | □ | ○ | □ | × | △ | 81.05% |
| 0.1 | □ | □ | □ | □ | □ | □ | □ | □ | △ | ○ | 91.90% |

□ · · · DETERIORATION LESS THAN 10%
○ · · · DETERIORATION BETWEEN 10% AND 30%
△ · · · DETERIORATION BETWEEN 30% AND 50%
× · · · DETERIORATION HIGHER THAN 50%

Fig.9

MATERIAL A                    $T_D = 373\,°K$

| $E_D$ kV/mm | DR | | | | | | | | | | CALCULATED DR |
|---|---|---|---|---|---|---|---|---|---|---|---|
| | 10% | | 30% | | 50% | | 70% | | 90% | | |
| | F(kHz) | | F(kHz) | | F(kHz) | | F(kHz) | | F(kHz) | | |
| | 1 | 10 | 1 | 10 | 1 | 10 | 1 | 10 | 1 | 10 | |
| 0.9 | □ | □ | ○ | △ | × | × | — | — | — | — | 26.31% |
| 0.7 | □ | □ | ○ | □ | × | △ | × | × | × | × | 45.57% |
| 0.5 | □ | □ | □ | □ | ○ | □ | × | △ | × | × | 58.83% |
| 0.3 | □ | □ | □ | □ | ○ | □ | × | ○ | × | × | 69.61% |
| 0.1 | □ | □ | □ | □ | □ | □ | ○ | ○ | × | × | 78.94% |

Fig.10

MATERIAL B $\qquad$ $T_D = 293°K$

| $E_D$ kV/mm | DR | | | | | | | | | | CALCULATED DR |
|---|---|---|---|---|---|---|---|---|---|---|---|
| | 10% | | 30% | | 50% | | 70% | | 90% | | |
| | F(kHz) | | F(kHz) | | F(kHz) | | F(kHz) | | F(kHz) | | |
| | 1 | 10 | 1 | 10 | 1 | 10 | 1 | 10 | 1 | 10 | |
| 0.7 | □ | □ | ○ | ○ | × | △ | × | × | — | — | 39.95% |
| 0.5 | □ | □ | □ | □ | ○ | □ | × | △ | × | × | 61.11% |
| 0.3 | □ | □ | □ | □ | □ | □ | ○ | ○ | × | △ | 76.61% |
| 0.2 | □ | □ | □ | □ | ○ | □ | ○ | □ | × | × | 83.28% |
| 0.1 | □ | □ | □ | □ | □ | □ | ○ | □ | △ | △ | 89.46% |

Fig.11

MATERIAL B  $T_D = 373\ °K$

| $E_D$ kV/mm | DR | | | | | | | | | | CALCULATED DR |
|---|---|---|---|---|---|---|---|---|---|---|---|
| | 10% | | 30% | | 50% | | 70% | | 90% | | |
| | F(kHz) | | F(kHz) | | F(kHz) | | F(kHz) | | F(kHz) | | |
| | 1 | 10 | 1 | 10 | 1 | 10 | 1 | 10 | 1 | 10 | |
| 0.7 | □ | □ | △ | ○ | × | × | × | × | − | − | 30.72% |
| 0.5 | □ | □ | ○ | □ | × | ○ | × | △ | × | × | 46.93% |
| 0.3 | □ | □ | □ | □ | ○ | □ | × | △ | × | △ | 58.83% |
| 0.2 | □ | □ | □ | □ | ○ | □ | △ | △ | × | × | 63.96% |
| 0.1 | □ | □ | □ | □ | □ | □ | △ | ○ | △ | △ | 68.70% |

Fig.12

MATERIAL C                                                $T_D = 293°K$

| $E_D$ kV/mm | DR | | | | | | | | | | CALCULATED DR |
|---|---|---|---|---|---|---|---|---|---|---|---|
| | 10% | | 30% | | 50% | | 70% | | 90% | | |
| | F(kHz) | | F(kHz) | | F(kHz) | | F(kHz) | | F(kHz) | | |
| | 1 | 10 | 1 | 10 | 1 | 10 | 1 | 10 | 1 | 10 | |
| 0.5 | □ | □ | ○ | □ | × | △ | × | × | – | – | 37.80% |
| 0.4 | □ | □ | □ | □ | △ | ○ | × | △ | × | × | 53.45% |
| 0.3 | □ | □ | □ | □ | ○ | □ | △ | ○ | × | △ | 65.47% |
| 0.2 | □ | □ | □ | □ | ○ | □ | ○ | □ | × | △ | 75.59% |
| 0.1 | □ | □ | □ | □ | □ | □ | ○ | □ | △ | ○ | 84.52% |

Fig.13

MATERIAL C $\quad T_p = 373°K$

| $E_p$ kV/mm | DR | | | | | | | | | | CALCULATED DR |
|---|---|---|---|---|---|---|---|---|---|---|---|
| | 10% | | 30% | | 50% | | 70% | | 90% | | |
| | F(kHz) | | F(kHz) | | F(kHz) | | F(kHz) | | F(kHz) | | |
| | 1 | 10 | 1 | 10 | 1 | 10 | 1 | 10 | 1 | 10 | |
| 0.5 | □ | □ | × | △ | × | × | — | — | — | — | 21.82% |
| 0.4 | □ | □ | △ | ○ | × | △ | × | × | — | — | 30.86% |
| 0.3 | □ | □ | ○ | ○ | × | △ | × | × | × | × | 37.80% |
| 0.2 | □ | □ | ○ | □ | × | △ | × | × | × | × | 43.64% |
| 0.1 | □ | □ | ○ | □ | △ | ○ | △ | ○ | △ | △ | 48.80% |

Fig.16

MATERIAL A                                    TD = - 293°K

| WAVEFORM | DRIVING FREQUENCY F (kHz) | | | | |
|---|---|---|---|---|---|
| | 10 | 15 | 20 | 30 | 35 |
| ⎍ | □ | □ | □ | □ | △ |
| ⎍⌐ | □ | ○ | × | — | — |

5,466,985

METHOD FOR NON-DESTRUCTIVELY DRIVING A THICKNESS SHEAR MODE PIEZOELECTRIC ACTUATOR

This is a Continuation of application Ser. No. 08/252,165 filed May 31, 1994, now abandoned.

BACKGROUND OF THE INVENTION

1. Field of the Invention

This invention relates to a method for driving a piezoelectric actuator. More particularly, this invention is drawn to a method for driving a shear mode piezoelectric actuator, where an electric field is applied to the piezoelectric actuator in a direction perpendicular to the axis of polarization of the piezoelectric actuator.

2. Description of Related Art

Today, diverse kinds of piezoelectric actuators are commercially available. These actuators are composed of ceramic, organic and/or composite piezoelectric materials. A piezoelectric actuator uses the displacement or generated force of the piezoelectric material, which is generated when the actuator is subjected to a driving electric field applied by a driving electrode.

Piezoelectric materials have three representative modes of deformation: a thickness expansion mode, a transverse expansion mode, and a thickness shear mode. The majority of conventional piezoelectric actuators include laminated piezoelectric actuators that use the thickness expansion mode, and unimorphic (or bimorphic) piezoelectric actuators that use the transverse expansion mode. In piezoelectric actuators based on the thickness expansion mode or transverse expansion mode, the axis of polarization of the piezoelectric material coincides with the direction of the applied driving electric field used to drive the actuator.

That is, in thickness expansion mode actuators, when the driving electric field is applied in the same direction as the polarization vector of the actuator, the piezoelectric material expands in the direction of the applied driving electric field. In contrast, in transverse expansion mode actuators, when the directions of the driving electric field and the polarization vector are the same, the piezoelectric material contracts in the direction perpendicular to the direction of the applied driving electric field. When the driving electric field is applied in a direction opposite to the polarization vector, the piezoelectric material contracts in the direction of the applied driving electric field in thickness expansion mode actuators, and expands in the direction perpendicular to the direction of the applied driving electric field in transverse expansion mode actuators.

Because the polarization direction and the driving electric field direction are aligned, a piezoelectric actuator using a thickness expansion mode material or a transverse expansion mode material can be returned to its initial state through a repolarization process. Repolarization becomes necessary when the polarized state of the piezoelectric material of the actuator has deteriorated due to raised operating temperatures or driving voltage disturbances during operation. That is, the piezoelectric material of these types of piezoelectric actuators can be repolarized using the driving electrodes, because the repolarization direction will coincide with the original polarization direction.

In contrast to the above-described piezoelectric actuators, in piezoelectric actuators using the thickness shear mode, the electric field is applied in a direction perpendicular to the direction of the polarization vector of the polarized piezoelectric material. That is, the polarization direction is perpendicular to the driving electric field direction. Thus, when the polarized state of the actuator has deteriorated due to raised operating temperatures or operating driving voltage disturbances, it is virtually impossible to reset a thickness shear mode piezoelectric actuator to its initial state through the repolarization process. That is, since the original polarization and driving electric field directions are not aligned, using the driving electrodes to repolarize this type of actuator would not return the actuator to its original polarization direction. Thus, the driving conditions for this type of piezoelectric actuator have yet to be clarified.

SUMMARY OF THE INVENTION

Thus, this invention provides a method for driving a thickness shear mode piezoelectric actuator such that it is driven stably without causing any deterioration in the initial polarized state of the component piezoelectric material.

The method for stably driving the thickness shear mode piezoelectric actuator comprises applying the electric field to the piezoelectric material using voltage pulses, the electric field being applied for a maximum period of 100 ms per cycle, and driving the piezoelectric actuator with voltage pulses such that:

$$DR < [\{(T_C - T_D)/(T_C - 273)\} \times \{(|E_C| - |E_D|)/|E_C|\}]^{1/2} \quad (1)$$

where, $T_C$ is the Curie temperature (in degrees Kelvin (° K)) of the piezoelectric material, $E_C$ is the coercive electric field in effect when the electric field is applied in the direction perpendicular to the direction of polarization; $T_D$ and $E_D$ are, respectively, the temperature (in degrees Kelvin (° K)) and the electric field of the material in effect during driving; and DR is the duty ratio of the pulse voltage applied during one cycle.

The method for driving the piezoelectric actuator of this invention prevents deterioration of the polarized state of the piezoelectric actuator as long as the duty ratio DR of each voltage pulse satisfies Equation 1.

As outlined, the thickness shear mode piezoelectric actuator operates by applying the electric field to the polarized piezoelectric material in the direction perpendicular to the polarization direction of that material. Because the electric field is applied perpendicularly to the polarization direction of its polarized piezoelectric material, polarized state of the thickness shear mode piezoelectric actuator may deteriorate due to raised operating temperatures or operating driving voltage disturbances. However, when operated according to this method, the thickness shear mode piezoelectric actuator operates stably for extended periods of time without the initial characteristics of the piezoelectric ceramic material deteriorating. The initial characteristics of the piezoelectric material will be stably maintained as long as the actuator is driven such that Equation 1 is satisfied.

These and other objects, features and advantages of the invention will become more apparent upon a reading of the following description and appended drawings.

BRIEF DESCRIPTION OF THE DRAWINGS

A preferred embodiment of this invention will be described in detail with reference to the following figures wherein:

FIG. 5 shows typical measurements of the Curie temperature and of the coercive electric field of each of various piezoelectric ceramic materials;

FIG. 8 shows measurements of the rate of deterioration in a first piezoelectric ceramic material under various driving conditions;

FIG. 9 shows addition measurements of the rate of deterioration in the first piezoelectric ceramic material under various driving conditions;

FIG. 10 shows measurements of the rate of deterioration in a second piezoelectric ceramic material under various driving conditions;

FIG. 11 shows measurements of the rate of deterioration in the second piezoelectric ceramic material under various driving conditions;

FIG. 12 shows measurements of the rate of deterioration in a third piezoelectric ceramic material under various driving conditions;

FIG. 13 shows measurements of the rate of deterioration in the third piezoelectric ceramic material under various driving conditions;

FIG. 16 shows additional measurements of the rate of deterioration in the piezoelectric ceramic material under various driving conditions.

DETAILED DESCRIPTION OF THE PREFERRED EMBODIMENT

Figure 1:
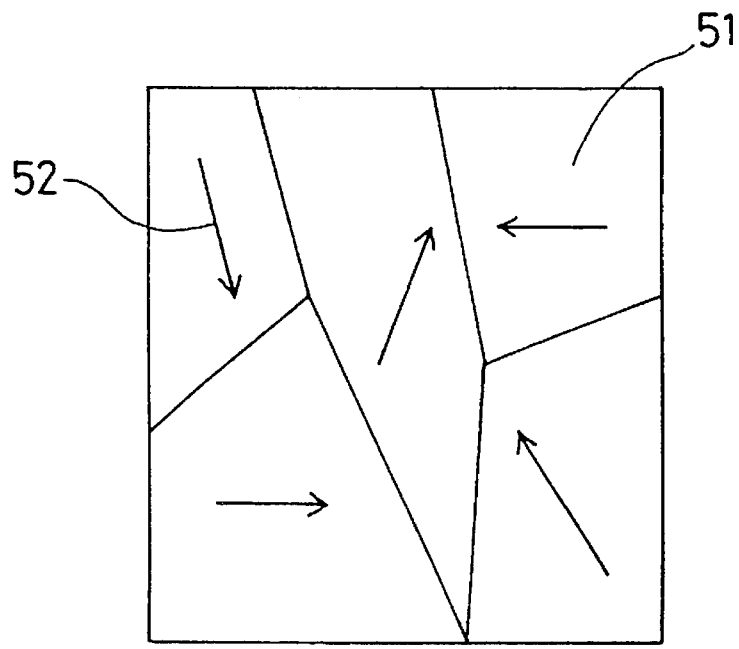
FIG. 1A shows a typical state of a ceramic material before being polarized.
FIG. 1B shows a typical state of the ceramic material after being polarized.
Figure 1:
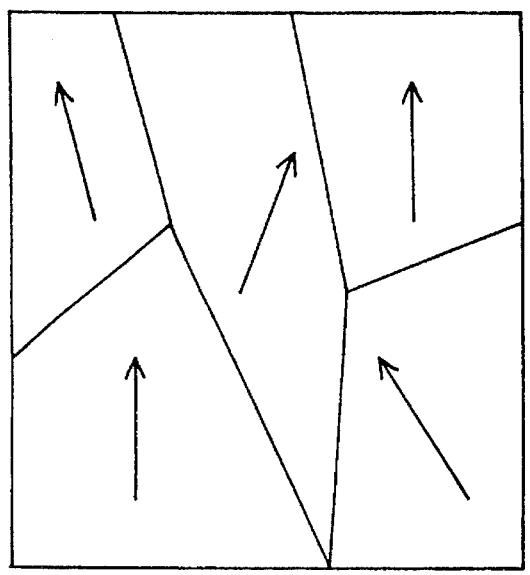

Most piezoelectric ceramic materials used in piezoelectric actuators are ferroelectric materials that possess spontaneous polarization. As shown in FIG. 1A the ceramic material is a polycrystal sintered body, having a number of domains 51. The direction of spontaneous polarization 52 in each domain 51 varies after sintering in a three-dimensional manner depending on the residual stresses inside the sintered body. The material in this state is subjected to an intense electric field to roughly align the various directions of spontaneous polarization 52. This treatment is called a polarization process. The polarized state of FIG. 1B is disturbed by high temperatures and strong electric fields.

Piezoelectric ceramic materials, notably titanic acid lead zirconate, have specific temperatures, called the Curie temperature, above which the ferroelectricity of the material disappears. That is, a piezoelectric ceramic material whose temperature is raised above its Curie temperature loses its ferroelectricity and instead becomes paraelectric. When the material's temperature is lowered below its Curie temperature, the material again manifests ferroelectricity. However, the material does not return to its initial polarized state resulting from the polarization process. Rather, the direction of spontaneous polarization becomes random inside the material, thus returning the material to the state shown in FIG. 1A. Even when the polarized material is exposed to a temperature lower than its Curie temperature, additional factors can also trigger changes in the polarized state of the piezoelectric ceramic material.

For example, a subsequent electric field is applied to the polarized material in a direction different from the direction of the electric field used in the polarization process. In this case, if the intensity of the subsequent electric field is higher than the coercive electric field of the material, the direction of spontaneous polarization unified by the polarization process is changed, thus altering the polarized state. The higher the applied temperature is, the more likely it becomes that the direction of spontaneous polarization will change. The polarization direction of the material will generally change when a direct current electric field on the order of milliseconds is applied to the material in question. However, experiments conducted by the inventor have revealed that, as will be described later, a continuation of a pulse train on the order of microseconds is sufficient to trigger a change in the polarization direction.

Thus, the thickness shear mode piezoelectric actuator need only be driven by a pulse voltage whose application time per cycle is a maximum of 100 ms. The driving condition needs to be set so as to eliminate any deterioration in the initial polarized state of the piezoelectric ceramic material, the degree of deterioration being variable depending on the temperature and the electric field intensity in effect during driving. The piezoelectric actuator driving method of the invention thus requires the following condition to be met:

$$DR < [\{(T_C - T_D)/(T_C - 273)\} \times \{(|E_C| - |E_D|)/|E_C|\}]^{1/2} \qquad (1)$$

where $T_C$ is the Curie temperature (in ° K) of the piezoelectric material; $E_C$ is the coercive electric field in effect when the electric field is applied in the direction perpendicular to the direction of polarization; $T_D$ and $E_D$ are, respectively, the temperature (in ° K) and the electric field of the material in effect during driving; and DR is the duty ratio of the pulse voltage during one cycle. Because the two parameters, temperature and driving electric field intensity, determine the duty cycle of the voltage pulse driving the actuator, deterioration in the polarized state of the piezoelectric ceramic material is prevented.

Figure 2:
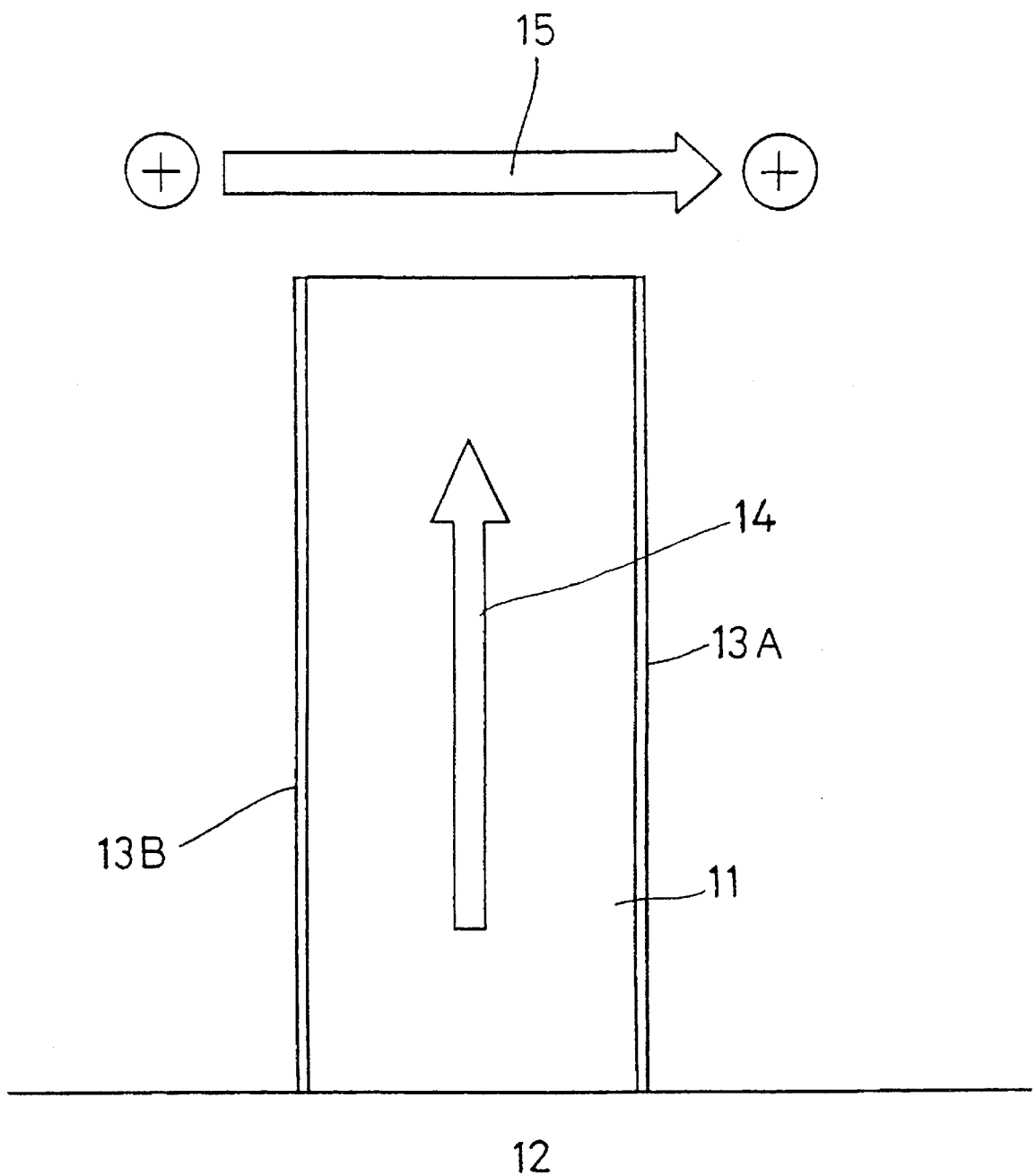
FIG. 2 is a schematic view of a piezoelectric ceramic material.
Figure 3:
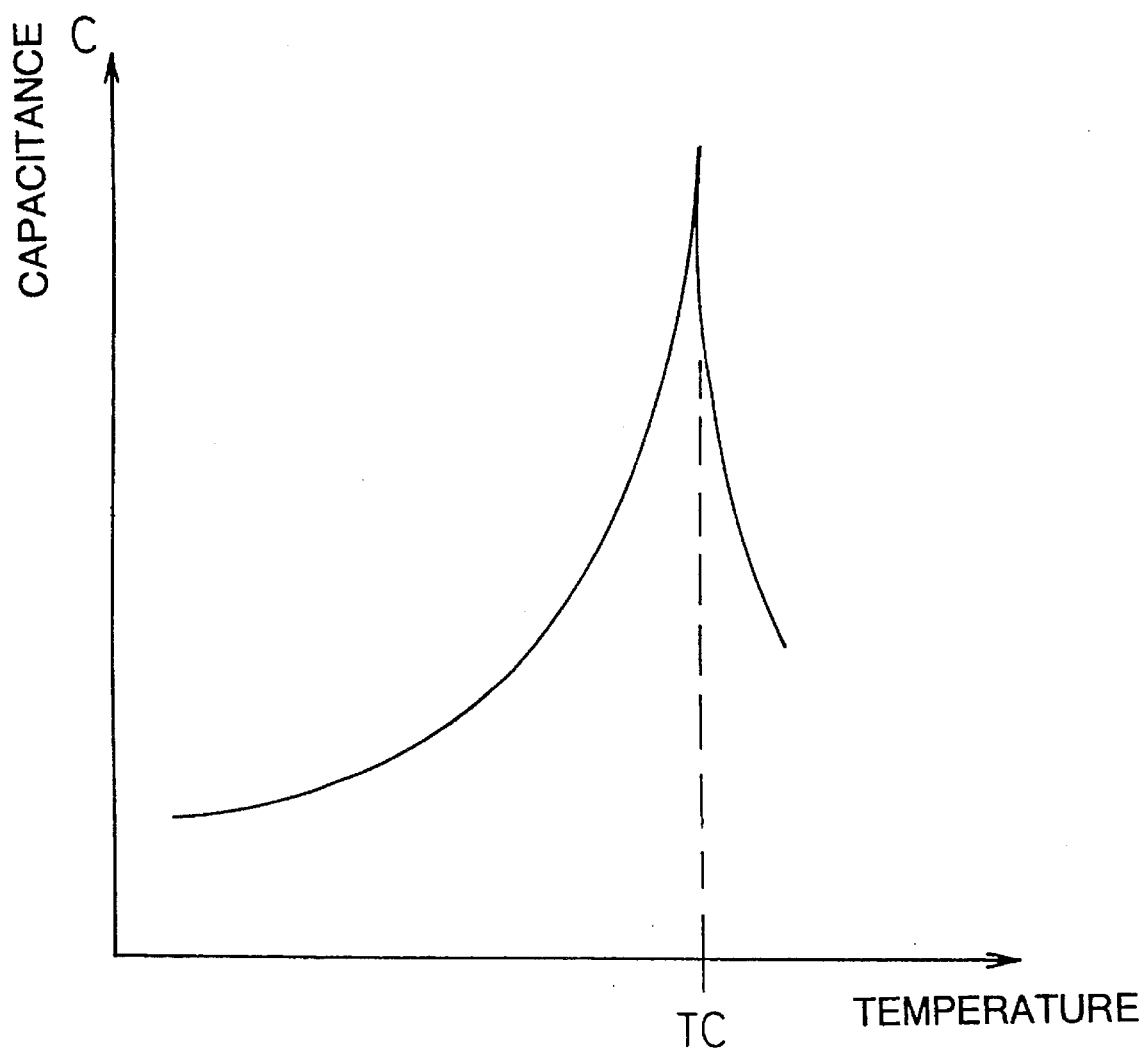
FIG. 3 is a graphic representation of typical relations between temperature and capacitance of the piezoelectric ceramic material.

A first preferred embodiment of the invention will now be described with reference to the accompanying drawings. FIGS. 2 through 4 show how the two parameters $T_C$ and $E_C$ were experimentally measured.

As shown in FIG. 2, a piezoelectric ceramic material 11 formed of titanic acid lead zirconate and measuring 1 mm wide, 10 mm high and 20 mm deep was prepared. The piezoelectric ceramic material 11 is polarized in the direction 14. Driving electrodes 13A and 13B are provided on both sides of the material 11. The Curie temperature of the piezoelectric ceramic material 11 was measured as follows.

Generally, piezoelectric ceramic materials have ferroelectricity at room temperature. Further, individual piezoelectric ceramic materials turn to paraelectric materials when heated to temperatures above their respective Curie temperatures. When the temperature of a typical piezoelectric ceramic material is plotted on the abscissa and the capacitance is plotted on the ordinate, as shown in FIG. 3, the capacitance is at a maximum near but below the Curie temperature transition from the ferroelectric to the paraelectric phase. In this example, the Curie temperature $T_C$ of each piezoelectric ceramic material 11 was defined as the temperature which maximized the capacitance of that material.

Figure 4A:
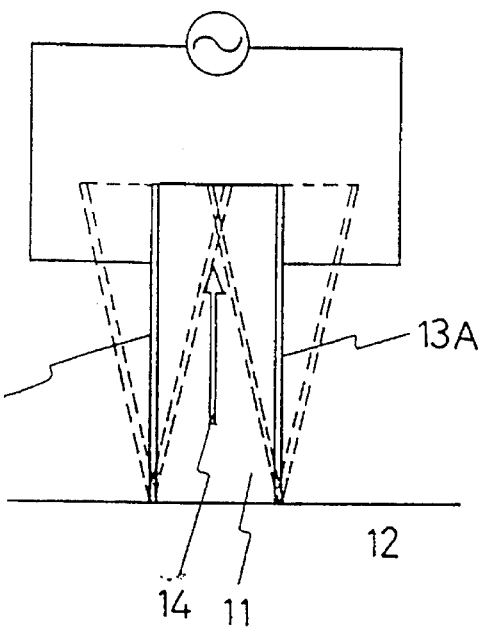
FIG. 4A shows how the resonant and anti-resonant frequencies of the piezoelectric ceramic material are illustratively measured.
Figure 4:
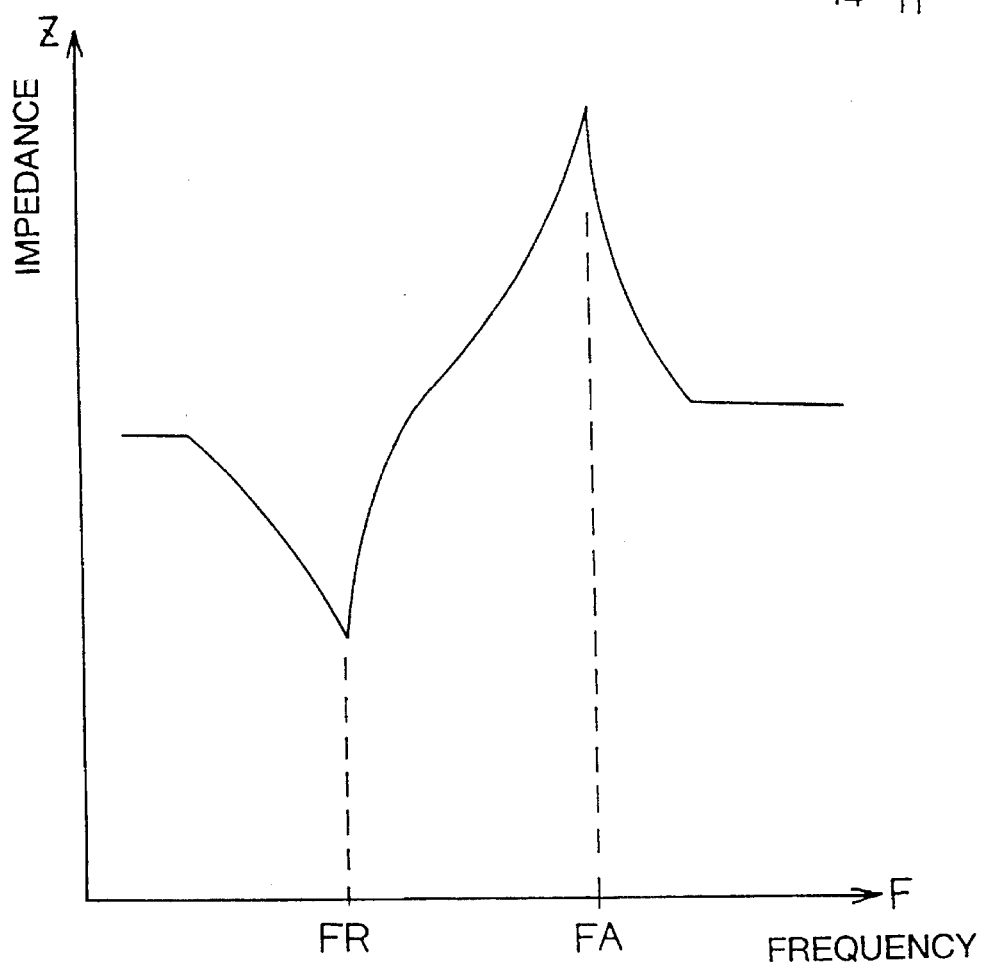
FIG. 4B is a graphic representation of typical relations between the impedance of the piezoelectric ceramic material, and its resonant and anti-resonant frequencies.

As depicted in FIG. 4A, an impedance analyzer was used to measure the resonant frequency $F_R$ and anti-resonant frequency $F_A$ of the piezoelectric ceramic material 11 in the thickness shear mode, the material being attached to an alumina plate 12. In FIG. 4B, the frequency F is plotted on the abscissa and the impedance Z is plotted on the ordinate. In this case, the frequency corresponding to the minimum impedance is the resonant frequency $F_R$ of the piezoelectric ceramic material 11 and the frequency corresponding to the maximum impedance is the anti-resonant frequency $F_A$ of the material. After the resonant and anti-resonant frequencies $F_R$ and $F_A$ were measured as initial values, a direct current electric field having a first voltage level was applied to the piezoelectric ceramic material 11 for 10 minutes in a direction perpendicular to the direction of polarization 14 of that material 11. The resonant frequency $F_R$ of the material was measured after applying the direct current electric field at the first voltage level. The voltage level of the direct current electric field was changed to a second voltage level. Then, the direct current electric field was again applied to the material for 10 minutes. The resulting resonant frequency $F_R$ was again measured. This process was repeated using further different voltage levels until the resonant frequency virtually disappeared. With this embodiment, the intensity or voltage level of the direct current electric field which caused the resonant frequency $F_R$ of the thickness shear mode to virtually disappear was obtained as the coercive electric field $E_C$ in effect when the electric field was applied in the direction perpendicular to the direction of polarization of the corresponding piezoelectric ceramic material 11.

FIG. 5 is a table of typical measurements of the Curie temperature $T_C$ and of the coercive electric field $E_C$ of each of three different piezoelectric ceramic materials. Of the piezoelectric ceramic materials listed, material A is a hard-type piezoelectric ceramic material having a high Curie temperature; piezoelectric ceramic material C is a soft-type material having a high piezoelectric constant and a low Curie temperature, and piezoelectric ceramic material B has intermediate characteristics.

Figure 6:
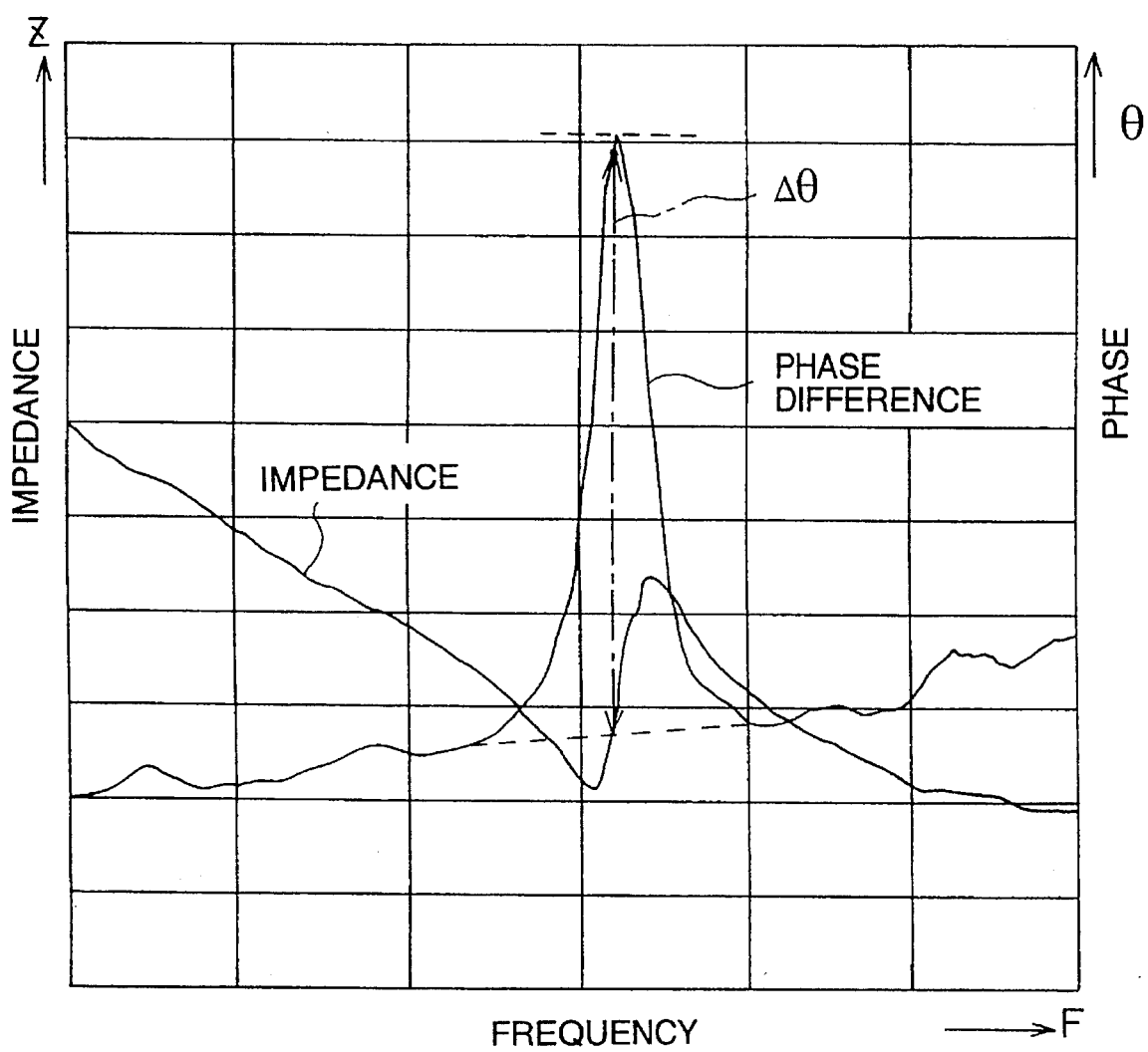
FIG. 6 is a graphic representation plotting typical measurements of phase angle changes taken when the piezoelectric ceramic material is in resonance.

The piezoelectric ceramic materials A, B and C were each used to form a sample in the shape depicted in FIG. 2. These samples were measured by an impedance analyzer for the frequency impedance characteristic in the thickness shear mode and for the concurrent change in phase difference. FIG. 6 graphically represents typical measurements of these parameters. The impedance Z at the resonant frequency $F_R$ and the absolute value of the phase angle change $\Delta\theta$ are determined from the type of material and the shape of the sample. If the polarized state of the piezoelectric material deteriorates, the direction of polarization of the material is partially disturbed and the unity of the resonance mode is lost. This causes the rate of change in the material's impedance Z to slow down and reduces the absolute value of the phase angle change $\Delta\theta$. As the polarization of the material continues to deteriorate, the resonance of the thickness shear mode ultimately disappears. In addition, the rate of change in the material's impedance Z disappears, as well as the phase angle change rate $\Delta\theta$ with this first preferred embodiment. Therefore, the rate of the phase angle change $\Delta\theta$, as shown in FIG. 6, defines the rate of deterioration of the piezoelectric ceramic material in question. The rate of deterioration was acquired based on measurements of the phase angle change rate $\Delta\theta$ taken relative to a maximum change rate of 100 percent.

Figure 7:
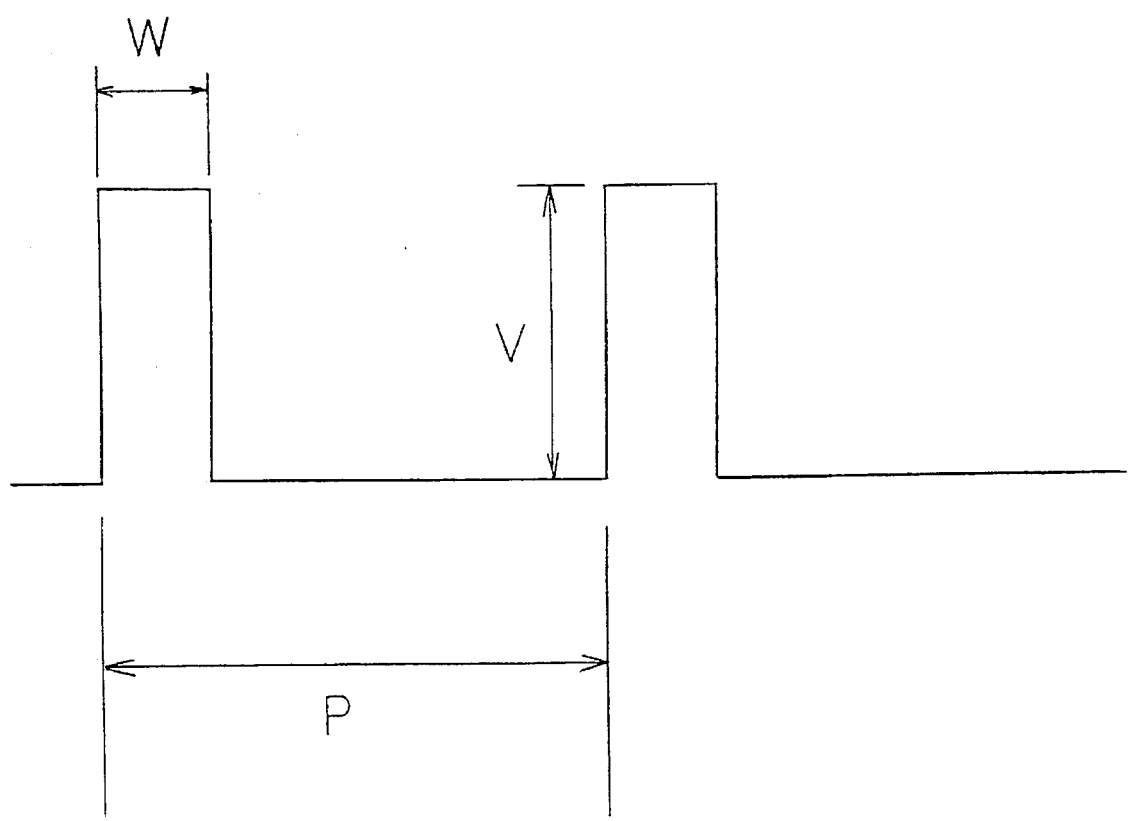
FIG. 7 is a schematic view of driving waveforms applied to the piezoelectric actuator.

Different driving pulses were then applied to each of the piezoelectric ceramic materials A, B and C for eight hours via the driving electrodes 13A and 13B. The driving frequency F of the pulses was varied by altering the pulse cycle P, as shown in FIG. 7. The driving electric field applied to the piezoelectric ceramic material was changed by varying the voltage pulse amplitude V. Furthermore, the duty ratio DR, the period of time in which the voltage pulse was applied during one cycle, was varied by altering the pulse width W.

In the above setup, measurements of the rate of deterioration in the piezoelectric ceramic materials A, B and C were taken under various conditions comprising such parameters as the driving electric field ED, the driving temperature $T_D$, the duty ratio DR and the frequency F. The results are shown in FIGS. 8 through 13. In each of these figures, a square (□) indicates that the rate of deterioration was less than 10%; a circle (o) indicates the rate was between 10% and 30%; a triangle (Δ) indicates the rate was between 30% and 50%; and a cross (×) indicates the rate was higher than 50%.

The measurements above coincided substantially with the theoretical values calculated by use of Equation 1 according to this invention. That is, the experiments demonstrated that if the duty ratio DR meets the conditions of Equation 1, then the deterioration in the polarized state of the piezoelectric ceramic material is minimal even after eight hours of continuous driving.

The thickness shear mode piezoelectric actuator has an electric field applied to the polarized piezoelectric material in a direction perpendicular to the axis of polarization of that material. Because of the way it works, this type of piezoelectric actuator is vulnerable to deterioration of its polarized state due to raised operating temperatures or driving voltage disturbances that may happen during driving. Once such deterioration occurs, it is impossible to reset the piezoelectric material to its initially polarized state. However, when the piezoelectric actuator is driven within the range defined by the Equation I as described above, the actuator is driven stably, with little deterioration in its polarized state, even when driven for extended periods of time.

Figure 14:
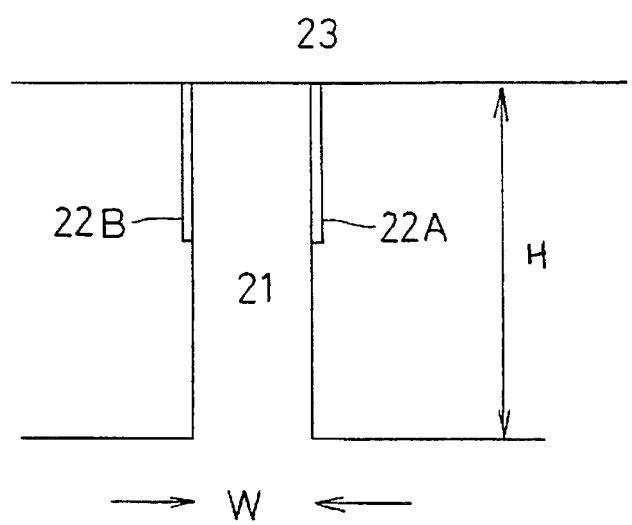
FIG. 14 is a schematic view of a thickness shear mode piezoelectric actuator.

FIG. 14 shows the thickness shear mode piezoelectric actuator of the ink jet head disclosed in U.S. Pat. No. 5,016,028. In this example, a specific condition for driving the piezoelectric actuator is determined as follows. In the experiment, the piezoelectric ceramic material A mentioned above was used to build a wall 21. The wall 21 is polarized in the direction of its height H. The wall 21 measures 0.1 mm wide and 0.5 mm high. The top of the wall 21 is attached to a lid 23. Driving electrodes 22A and 22B sandwich both sides of the upper half portion of the wall 21. With its upper end fixed, the wall 21 develops a shear deformation in its upper half portion when a driving voltage is applied between the driving electrodes 22A and 22B. The lower half portion of the wall 21, which is not covered by the driving electrodes 22A and 22B, develops an elastic deformation as a result of the shear deformation in the upper half portion. Thus, the wall 21 as a whole deforms into a dogleg shape. To drive the piezoelectric actuator of this ink jet head requires applying a driving electric field of 0.5 kV/mm for a 20 μsec pulse-on time at a temperature of 20° C. (293° K). The driving pulse waveform is a simple rectangular pulse waveform shown in the upper half of FIG. 16.

The duty ratio DR for driving the piezoelectric actuator, when calculated on the basis of Equation 1, is given in Equation 1:

$$DR < 0.68$$

Since the Curie temperature $T_C$ of the piezoelectric ceramic material A is 325° C. (598° K) and the coercive electric field $E_C$ of that material is 1.0 kV/mm, from FIG. 5. Thus, the maximum allowable frequency is about 34 kHz, when the actuator is driven by simple rectangular waveform pulses. In other words, it is necessary to design the above piezoelectric actuator so that it will operate at driving frequencies preferably lower than 34 kHz.

Figure 15:
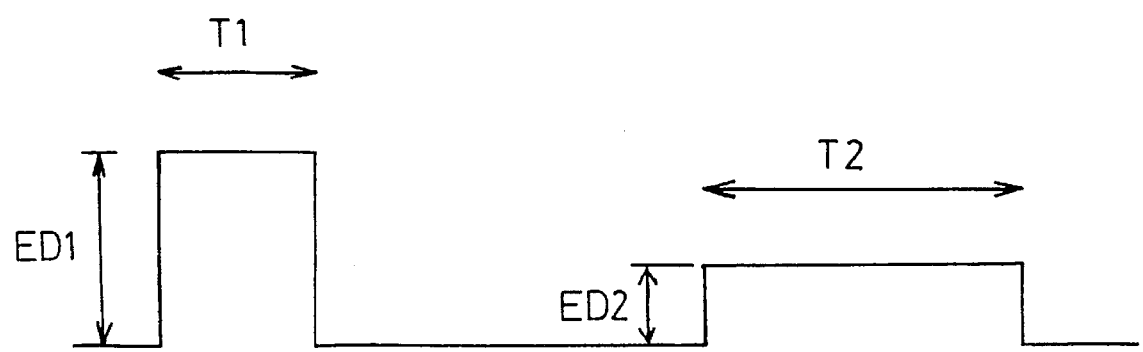
FIG. 15 is a schematic view of driving waveforms for driving the piezoelectric actuator.

FIG. 15 shows a second preferred embodiment of the method. That is, the driving pulse waveform shown in FIG. 15 is needed to drive the piezoelectric actuator. In that case, of the two pulses shown, the first pulse is denoted by $E_{D1}$ and the second by $E_{D2}$, their pulse widths being represented by $T_1$ and $T_2$, respectively. Initially, the values of $T_1/E_{D1}$ and $T_2/E_{D2}$ are obtained by use of critical duty ratios $DR_1$ and $DR_2$ acquired for the respective pulses. The results lead to the Equation 3:

$$F_{max} = 1/\{(T_1/DR_1) + (T_2/DR_2)\} \quad (3)$$

where $F_{max}$ is the maximum driving frequency. For example, if the piezoelectric ceramic material A is used at a temperature of 20° C., where $E_{D1}=0.5$ kV/mm, $T_1=20$ μsec, $E_{D2}=0.2$ kV/mm and $T_2=40$ μsec, then $DR_1<0.68$ and $DR_2<0.86$. It follows that $T_1/DR_1>29.4$ μsec and $T_2/DR_2>46.5$ sec. Thus the maximum driving frequency is about 13.2 kHz.

FIG. 16 is a table of the measurements of the rate of deterioration in the piezoelectric ceramic material being driven consecutively for eight hours at various frequencies using the above-described two different pulse waveforms. The deterioration is represented by the rate of phase angle change Δθ in resonance. The results of the experiment coincided substantially with the theoretical results calculated according to this invention.

In the examples above, the temperatures in effect during driving were above zero degrees Celsius (273° K). Alternatively, the temperatures may drop below zero degrees Celsius and the results are still the same. Thus the expression of the stable driving condition is given by Equation 1.

As many apparently different embodiments of this invention may be made without departing from the spirit and scope thereof, it is to be understood that the invention is not limited to the specific embodiments thereof except as defined in the appended claims.

What is claimed is:

1. A piezoelectric actuator driving method for applying an electric field to a polarized piezoelectric material in a direction perpendicular to a polarization direction of the piezoelectric material, the method comprising the steps of:

applying a cyclic electric field to said piezoelectric material as said electric field, the cyclic electric field having a maximum period of 100 ms per cycle; and driving said piezoelectric actuator with the cyclic electric field, a duty ratio DR of said cyclic electric field determined by:

$$DR < [\{(T_C - T_D)/(T_C - 273)\} \times \{(|E_C| - |E_D|)/|E_C|\}]^{\frac{1}{2}}$$

where $T_C$ is a Curie temperature of said piezoelectric material in ° K; $E_C$ is a coercive electric field of said electric field; $T_D$ is a driving temperature in ° K; and $E_D$ is a driving voltage of the cyclic electric field.

2. The piezoelectric actuator driving method of claim 1, wherein said piezoelectric material is a titanic acid lead zirconate material.

3. A piezoelectric actuator driving method for applying an electric field to a polarized piezoelectric material in a direction perpendicular to a polarization direction of a piezoelectric material, the method comprising:

applying a cyclic electric field to said piezoelectric material as said electric field, the cyclic electric field having a period;

determining a duty ratio of said cyclic electric field based on a Curie temperature of said piezoelectric material, a coercive electric field of said cycle electric field, a driving temperature, and a driving voltage of the cyclic electric field; and driving said piezoelectric actuator with the cyclic electric field having the duty ratio determined in the duty ratio determining step.

4. The piezoelectric actuator driving method of claim 3, wherein said period of said cyclic electric field is at most 100 ms.

5. The piezoelectric actuator driving method of claim 3, wherein said duty ratio is less than 0.68.

6. The piezoelectric actuator driving method of claim 3, wherein the duty ratio determining step comprises the step of varying the duty ratio inversely to the driving voltage of the cyclic electric field.

7. The piezoelectric actuator driving method of claim 3, wherein the duty ratio determining step comprises the step of varying the duty ratio inversely to the driving temperature.

8. The piezoelectric actuator driving method of claim 3, wherein the duty ratio determining step comprises the step of varying the duty ratio proportionally with the period of the cyclic electric field.

9. The piezoelectric driving method of claim 3, wherein the duty ratio determining step comprises the step of varying the duty ratio proportionally with the Curie temperature of the piezoelectric material.

10. The piezoelectric actuator driving method of claim 3, wherein the duty ratio determining step comprises the step of varying the duty ratio proportionally with the coercive electric field of the cyclic electric field.

\* \* \* \* \*